(12) United States Patent
Roden et al.

(10) Patent No.: US 6,940,266 B2
(45) Date of Patent: Sep. 6, 2005

(54) ENHANCED COST EFFECTIVE METHOD FOR HIGH CURRENT MEASUREMENTS

(75) Inventors: Garey George Roden, Apalachin, NY (US); Nick Charles Marco, Susquehanna, PA (US); Kevin James Coppage, Candor, NY (US)

(73) Assignee: BAE Systems Controls, Inc., Johnson City, NY (US)

( * ) Notice: Subject to any disclaimer, the term of this patent is extended or adjusted under 35 U.S.C. 154(b) by 0 days.

(21) Appl. No.: 10/738,856

(22) Filed: Dec. 17, 2003

(65) Prior Publication Data

US 2005/0134254 A1 Jun. 23, 2005

(51) Int. Cl.[7] .............................. G01R 1/00; H01C 7/00
(52) U.S. Cl. ........................................ 324/126; 338/49
(58) Field of Search .................... 324/117 R, 126–127; 338/49

(56) References Cited

U.S. PATENT DOCUMENTS

| 4,001,684 | A | * | 1/1977 | Fritts ........................... 324/126 |
| 4,140,961 | A | * | 2/1979 | Akamatsu .................... 323/358 |
| 4,973,937 | A | * | 11/1990 | Weinstein et al. ............ 338/49 |
| 6,528,960 | B1 | * | 3/2003 | Roden et al. ................ 318/254 |
| 6,781,360 | B1 | * | 8/2004 | Dragoi et al. ............... 324/126 |

* cited by examiner

Primary Examiner—Paresh Patel
(74) Attorney, Agent, or Firm—William H. Meise; Geoffrey H. Krauss

(57) ABSTRACT

An electrical connection between a power source and a threaded aperture in a power device is made by means of a terminal lug and a bolt. In order to measure the current, a second electrical path is made in parallel with the bolted connection, and current in the second path is sensed. The bolt may carry the main current, or an insulating spacer may be used which prevents significant current flow in the bolt. In one embodiment, the parallel current path extends through a conductor arrangement including additional lugs through which the bolt passes, and in another arrangement the parallel path extends through traces of a printed circuit board.

15 Claims, 10 Drawing Sheets

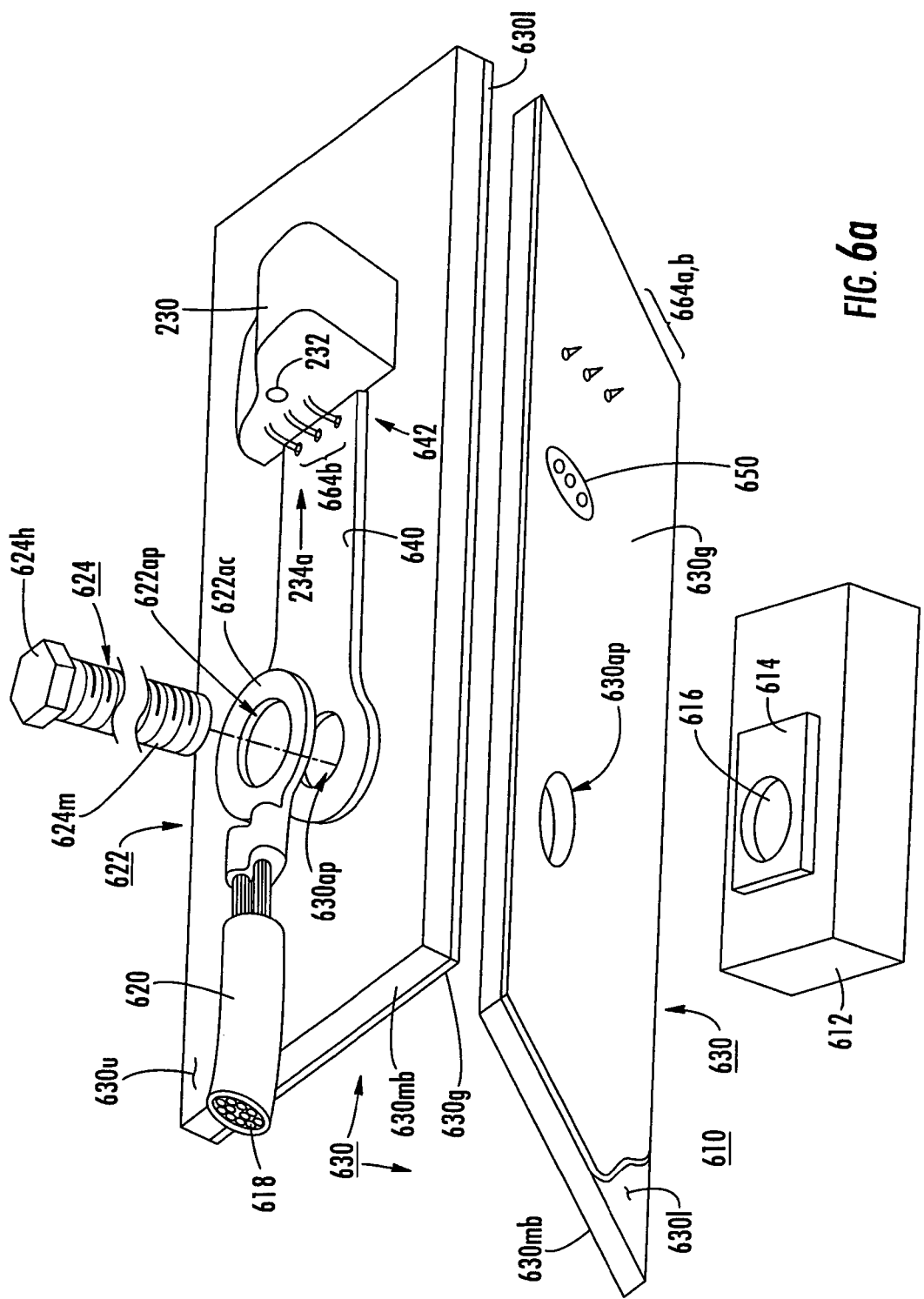

ENHANCED COST EFFECTIVE METHOD FOR HIGH CURRENT MEASUREMENTS

FIELD OF THE INVENTION

This invention relates to the measurement of alternating currents in machines, and more particularly to the measurements of currents larger than one ampere in a cost-effective manner.

BACKGROUND OF THE INVENTION

Electrically powered vehicles have recently become more important as environmental concerns grow. A problem with electrically powered vehicles is that with current technology, vehicle range is limited to an extent that many users find inconvenient. The use of hybrid internal-combustion/electric vehicles has been proposed in order to address the problem of limited range, and such vehicles are beginning to find use. Another problem with electrically powered or partially electrically powered vehicles is that the technology is not well developed for storing large amounts of electrical energy as may be required, and for controllably converting the energy so stored into usable vehicle traction motor current.

Many electrical power and drive schemes have been proposed and tried. Many of these techniques rely on microprocessor- or digital-signal-processor-controlled controllers, which perform sophisticated analyses for generating the desired control signals which, in turn, control the application of relatively large traction currents to the vehicle traction motor. Among these sophisticated control schemes are the field-oriented-control (FOC) applied to induction traction motors. Sophisticated controllers generally require substantial information about the vehicle operator commands, the state of the battery charge, the vehicle speed, and the motor current or currents, in the context of multiphase or polyphase motors. Such controllers may also provide for dynamic braking, in which vehicle kinetic energy is returned to the traction battery concurrently with braking. The controllers may also control the operation of an internal combustion engine in the case of hybrid electric vehicles. The required information often involves the measurement of motor andor battery currents and phases.

As mentioned, the technology is not well developed for operation of vehicle motors from traction storage batteries or from the newer ultracapacitors which may be used for electrical energy storage. For example, battery voltages are in direct-voltage (DC) form, and the traction power may be such as to require currents currently in the range of up to one thousand amperes, but which may be larger in the future. Handling currents in the hundreds or thousands of amperes has long been known, but principally in a laboratory setting. In a laboratory, it is easy to handle such large currents by the use of machined bus bars and large cables. Generally, however, the types of devices used in laboratory settings are not directly usable in the context of a vehicle, where light weight, reliability under adverse weather and operating conditions, and low cost are important factors.

The great cost and inconvenience of conventional sensors capable of operation at high currents has led some motor controller designers to opt for "open loop" sensors rather than conventional "closed-loop sensors." Unfortunately, the accuracy of the current sensing is adversely affected by such sensors, especially over a range of temperatures, which in turn requires a rotational position encoder or resolver for control of induction machines. The use of open-loop sensors also has the disadvantage that overcurrent protection is complicated by the sensitivity of the current sensors to high-frequency noise. This sensitivity manifests itself as tripping of the overcurrent device due to noise generated by the open-loop current sensor.

FIG. 1 illustrates a vehicle designated generally as 10 includes a rotational vehicle drive device illustrated as a wheel 12, as described in U.S. Pat. No. 6,528,960 issued Mar. 4, 2003 in the name of Roden et al. In FIG. 1, wheel 12 is mechanically coupled by way of a mechanical coupling 14 to a motor 16. Vehicle 10 also includes a source 18 of electrical energy or power, which may be, for example, an electrochemical battery or a generator driven by a prime mover, or may possibly be an ultra-high-capacity capacitor. Energy source 18 is coupled to motor 16 by means of a power-controlling device illustrated as a switcher block 20. Switcher block 20 controls the application of electrical energy or power to motor 16 under the control of a controller, processor or digital signal processor (DSP) 22. Controller 22 responds to user command signals such as braking signals and "accelerator" or "throttle" signals from the user. The origin of such user signals is illustrated as a block 24.

Vehicle 10 of FIG. 1 is generic, in that the description is generally applicable to all "series" vehicles which are at least partially powered by electricity. One sophisticated type of electric vehicle control is the field-oriented control (FOC). Field-oriented control can be used with at least induction motors. Field-oriented controllers make use of a great deal of information relating to the vehicle operation, including operator control input signals, signals representing the motor current, bus, electrical source, or motor drive voltage, and, if battery condition is to be monitored and maintained, battery current, temperature and the like. In FIG. 1, a resolver (R) is illustrated as being coupled to mechanical drive coupling 14, for generating a motor or wheel speed signal for application to the controller 22. In actual practice the motor rotor position is derived from the resolver. The motor velocity and acceleration may then be calculated from the change in position as a function of time. In addition to the resolver input signals, controller 22 of FIG. 1 receives at least one signal from a current sensor C coupled to measure the electrical current in a motor power conductor $16i_1$. In the case of a polyphase motor, a motor current signal may be received by controller 22 for all but one of the motor power conductors, and the current in the last, unmeasured power conductor can be calculated from the remaining currents. The measurements of motor current and bus voltage allow the motor power and power direction (for dynamic braking) to be calculated.

Since the motor performance and control is determined, at least in part, from measurements of current, it is important that the currents so measured be accurate. This is particularly so in the case in which a polyphase motor is used, because the calculations may include taking the differences between or among the various currents. If the sensors are not very accurate, the calculated differences may be very inaccurate.

As mentioned, the currents drawn by the traction motor in a vehicle context may be hundreds or even thousands of amperes in magnitude. Resistive current sensors such as a series resistor and associated voltammeter are not practical, because of the effect on the fuel economy or range of the vehicle of the heating losses caused by the flow of the motor current through the resistance, and also because the varying current in the resistor results in a change in its resistance, requiring some sort of calibration to maintain accuracy. An additional disadvantage of simple resistive current sensors is that they are not electrically isolated, so the bus voltage source is coupled to the system controller, which can undesirably couple dangerous or damaging voltages to the controller under certain circumstances. Commercial current measuring devices capable of accurately measuring currents in the range of hundreds and thousands of amperes are available, but are expensive. Among such sensors are "closed loop" current transducers such as type LT 505-S/SP 8, manufactured by LEM Business Area Components, 8, Chemin des Aulx, CH-1228 Plan-les-Ouates, Switzerland, which also has offices in the U.S. at 27 RT 191A, PO Box 1207, Amherst, N.H. 03031. Other versions of this type of transducer which are available at relatively small cost are the type LTS 25, which have a nominal current capacity of 25 amperes. In addition, other inexpensive current transducers of the "open-loop" type are available. These tend to be less accurate than the "closed-loop" type, and are subject to unwanted noise signals. Plot 510 of FIG. 5 illustrates the characteristic of the nominal 25-amp rated LTS 25. In FIG. 5, the sensed signal at zero transducer current is at a finite value V, which corresponds to about 2½ volts, which is half of the energizing voltage of 5 volts. Signal output greater than 2½ volts represents "positive" current directions, and signal outputs less than 2½ volts represent "negative" currents. As illustrated, the nominal (NOM) transducer current is not the value at which the sensed current is limited, but rather lies near the center of each side of the plot; the NOM value for the LTS 25 is 25 amperes. The sensor output signal limits in both the positive and negative directions at a value of current which is designated "max." In the case of the LTS 25, these correspond to about 80 amperes.

As described in the abovementioned Roden et al. patent, the sensing of the motor current in an electrically powered vehicle is performed by a current sensing arrangement including a commercial current sensor capable of measuring a maximum current much smaller than the peak motor current, together with a current dividing scheme which allows most of the motor current in any particular phase to flow to the motor without measurement, and which passes only a fraction of the motor current of that phase through the current sensor.

FIG. 2*a* illustrates one embodiment of a current sensor arrangement 210 suitable for use for measuring motor current in one form of electrically powered vehicle, as described in the Roden et al. patent. In FIG. 2*a*, arrangement 210 includes a first lug, terminal or electrode 212 which is made from a conductive material such as plated copper. Lug 212 includes a flat portion 212*f* defining an aperture 212*a* dimensioned to clear a screw or bolt for fastening the lug to a further electrical conductor. In addition to flat portion 212*a*, lug 212 includes an offset conductor-clamping portion 212*occ*. Conductor-clamping portion 212*occ* defines a receptacle (not visible in FIG. 2*a*) into which the ends of electrical conductors or wires 216, 218, 220, and 222 are placed. The ends of electrical conductors 216, 218, 220, and 222 are crimped in place and forced into intimate electrical contact with the conductor-clamping portion 220*occ* by a pair of crimps or indentations 212*c*1 and 212*c*2. As illustrated, each electrical conductor 216, 218, 220 and 222 is insulated by an insulating layer 216*i*, 218*i*, 220*i*, and 222*i*. As also illustrated in FIG. 2*a*, the remote ends of wires 216, 218, 220, and 222 are inserted into a receptacle 214R in an offset conductor clamping portion of a lug 214, and are crimped in place to provide good electrical contact by a pair of crimps or indentations 214*c*1 and 214*c*2. Lug 214 also includes a flat portion 214*f* which defines an aperture 214*a*.

It should be noted that the term "between" and other terms such as "parallel" have meanings in an electrical context which differ from the meanings in the field of mechanics or in ordinary parlance. More particularly, the term "between" in the context of signal or electrical flow relating to two separate devices, apparatuses or entities does not relate to physical location, but instead refers to the identities of the source and destination of the flow. Thus, flow of signal "between" A and B refers to source and destination, and the flow itself may be by way of a path which is nowhere physically located between the locations of A and B. Similarly, the term "parallel" in an electrical context can mean, for digital signals, the simultaneous generation on separate signal or conductive paths of plural individual signals, which taken together constitute the entire signal. For the case of current, the term "parallel" means that the flow of a current is divided to flow in a plurality of separated conductors, all of which are physically connected together at disparate, spatially separated locations, so that the current travels from one such location to the other by plural paths, which need not be physically parallel.

In FIG. 2*a*, a commercially available current transducer having a 25 ampere nominal non-limiting range is illustrated as 230. The particular type of transducer which is illustrated is the abovementioned type LTS 25. Conductor 222 extends through an aperture 232 in the transducer 230 in a noncontacting or isolated manner. Transducer 230 also includes pins 236, 238, and 240, by which energization potential can be applied to the transducer and signal output can be extracted from the transducer. As with the terms "between" and "parallel," the term "noncontacting" is used in an electrical rather than a mechanical sense.

The term "noncontacting" means that an electrical insulator (which may include free space) lies between the noncontacting electrical conductors, so that the current flow in one is, as a practical matter, unaffected by the voltage on the other. In essence, the term means that a high resistance is interposed between, or lies between, the electrical conductors in question, where the dimension corresponding to "high" depends upon the impedances of the two noncontacting circuits and the amount of allowable interaction.

Those skilled in the art know that electrical current can flow only in a complete circuit, which implies that existence of a single current through a device involves a two-wire connection to the device, one for current "into" the device, and another for "output" current. Thus, an arrangement such as that of FIG. 2A, having "input" and "output" terminals 212, 214, represents only a portion of a circuit in which current flows, namely the current-sensing portion of the circuit. Other portions of the complete current path may include the current utilization device, which in the case of FIG. 1 is a motor winding.

Transducer 230 of FIG. 2*a* also provides two sets of electrically paralleled pins, only one of which is visible in FIG. 2*a*, and is designated 234*a*. A corresponding set on the other or non-visible side is merely a continuation of the pin set 234*a*. The conductor(s) associated with pin set 234*a* extend through the same region of the transducer as the conductor 222, and merely provide a corresponding path through the transducer which is available for mounting to a printed-circuit board. Whether the current to be sensed flows through the transducer by way of a conductor extending through aperture 232 or by way of pin set 234*a*, the transducer acts in a noncontacting manner, which is to say that there is no direct path (except possibly leakage paths) between the conductor carrying the current which is to be measured (either through aperture 232 or by way of pin set 234*a*) and the signal and power pins 236, 238, and 240.

FIG. 2*b* is a schematic diagram illustrating the structure of the arrangement 210 of FIG. 2*a*. It will be seen that the electrical conductors 216, 218, 220, and 222 are electrically connected in parallel, which is to say that the current Is to be sensed flowing between terminals or nodes 212 and 214 divides to flow through the various conductors in inverse proportion to their resistance. Since the four electrical conductors 216, 218, 220, and 222 are identical, identical currents flow through each wire, so long as the contact between the electrical conductors and the lugs 212, 214 is good. Consequently, the current flowing through electrical conductor 222 is only a fraction of the total current flowing between lugs 212 and 214, and the fractional portion is determinable. In the case illustrated in FIGS. 2*a* and 2*b*, the current in conductor 222 will be the total current divided by the total number of conductors extending between lugs 212 and 214. In the particular case, there are a total of four wires, so the current in conductor 222 will be the total current divided by four. For a maximum current to be sensed of 100 amperes, a four-wire arrangement such as that of FIGS. 2*a* and 2*b* would have 25 nominal amperes through the current sensor 230, which does not exceed its current rating. As described in conjunction with FIG. 5, the maximum measurable current may exceed 25 amperes. Naturally, if there were five conductors in the arrangement of FIG. 2B rather than four, the fraction of the lug-to-lug current which would flow in conductor 222 would be ⅕. If the lug-to-lug current were to be a maximum of 100 amperes, the current through the current transducer would be a maximum of 20 amperes, well within the rated current of the transducer, or alternatively the maximum current to be sensed might be 125 amperes for a 25-ampere rating of the transducer or sensor. Thus, a relatively inexpensive 25-ampere current transducer or sensor can be used to measure a current of 125 amperes.

More generally, additional paralleled electrical conductors or wires can be used to provide almost any desired current division ratio so as to maintain current through the transducer or sensor within its ratings while allowing many times that current through the entire circuit. Thus, a current with a maximum value of 1000 amperes, could be measured by 25-ampere rated transducer or sensor in the presence of a total of forty electrically paralleled conductors.

The arrangement of FIG. 2*a* has the advantage that all of the high-current conductors 216, 218, 220, and 222 are in the same environment, so that any air flow over their surfaces will tend to be the same, and the thermal conduction to the lugs should also be the same. Consequently, the temperature rise in each of the electrical conductors should be approximately equal. It is expected that any current-splitting deviation attributable to temperature differences will be small enough to not affect the performance. One possible disadvantage of the arrangement of FIG. 2A is that slight differences in contact force to the various paralleled wires at the crimped portions of the lugs 212 and 214 may provide differing resistance connections. Such different resistances may heat differently, and result in substantial differences in the effective resistance through the various paralleled wires, which could adversely affect sensing accuracy.

FIG. 3*a* is a simplified perspective or isometric view of a printed-circuit current sensing assemblage as described in the Roden et al. patent. In FIG. 3*a*, an assemblage 310 includes a printed board assembly 320 and two connecting posts or terminals 312 and 314. Posts or terminals 312, 314 are the terminals between which the large electrical current which is to be sensed flows. Posts or terminals 312 and 314 each include an insulating support 312*i*, 314*i*, respectively, and an electrically conductive ring 312*r*, 314*r*, respectively, which is in electrical contact with its post or terminal.

Printed-circuit assemblage 320 of FIG. 3*a* includes a dielectric substrate 322, with patterned "printed circuit" conductors 324 and 326 on its upper and lower sides, respectively. As illustrated, substrate 322 defines first and second apertures 332 and 334 dimensioned to accept posts 312 and 314, respectively, for allowing rings 312*r* and 314*r* of posts 312 and 314 to make contact with the lower printed circuit conductor 326, and for allowing posts 312 and 314 to make electrical contact with upper printed conductor 324 with the aid of conductive washers 312*w* and 314*w* and nuts 312N, 314N. Thus, the upper printed conductor 324 and the lower printed conductor 326 are effectively in electrical parallel.

A printed gap pattern 340 is defined on the upper printed conductive surface 324 of printed circuit assemblage 320, as illustrated in FIGS. 3*a* and 3*b*. As illustrated, the gap 340 defines plural gap sections. The principal gap which appears on the conductive upper surface 324 divides the upper conductive surface 324 longitudinally into two conductive portions 1 and 2, where the term "longitudinally" refers to a direction extending from aperture 332 to aperture 334. These two electrical conductors are in electrical parallel as to current flowing from post 312 to post 314, much as the conductors 222 and 220 are in parallel in FIG. 2*a*. There is a difference between the situation in FIG. 2*a* and that of FIG. 2*b*, and that difference lies in the fact that the dimensions of the electrical conductors 1 and 2 are different from each other. This allows control of the relative current division by controlling the dimensions, rather than the number of, the paralleled conductors. More particularly, the printed-circuit board fabrication techniques result in a generally uniform conductor thickness, which may be, for example, 0.035 inch. Thus, the cross-sectional dimension of conductors 1 and 2 depends only on their widths. If the width of conductor 1 were, say, three times the width of conductor 2, its resistance would be one-third that of conductor 2. The current division could in that case be readily determined to be 1/(3+1) or 1/4, meaning that the current in conductor 2 would be ¼ of the total current flowing from post 312 to post 314.

The printed circuit upper pattern illustrated FIG. 3*b* includes an open or nonconductive region 338*u*, which is provided to accommodate the power and signal pins of the transducer and the pins or sockets of a connector allowing connection of an external cable to the printed circuit board for the purpose of energizing the transducer and coupling signal therefrom.

The printed-circuit arrangement described in conjunction with FIGS. 3*a* and 3*b* has the advantages of consistency from unit to unit, since they are fabricated by batch-like processing. In addition, the relatively flat morphology allows for relatively large heat dissipation in response to airflow over the large, flat surfaces. It further provides a convenient and inexpensive mounting for the current sensor or transducer 230. As illustrated in FIG. 3*a*, transducer 230 is mounted on the upper surface of printed circuit board 320, with its through three-pin set 234*a* extending into three apertures designated together as 364*a* and are soldered or otherwise electrically bonded to conductor 1. The corresponding portions of pin set 234*a* on that side of transducer 230 which is not visible in FIG. 3*a* extend into apertures designated 364*b* in conductor 1. As best illustrated in FIG. 3*b*, a portion 342*u* of gap 340 extends between aperture sets 364*a* and 364*b*, so as to prevent the direct flow of current, and so as to force any current flowing in conductor 1 to pass through the transducer 230 by way of its pin set 234*a*. Also, when transducer 230 is mounted in place as illustrated in FIG. 3a, its signal and power pins 236, 238 and 240 extend through apertures 386, 388, and 390, respectively, in board 320, and are soldered to conductors on the reverse side, for making appropriate connections. The presence of gap 342L on the reverse or underside of the board prevents the lower printed conductor 326 from short-circuiting the pins 364a of the transducer.

FIG. 3c illustrates a plan view of the underside of printed circuit board 320, showing the printed pattern thereon. The surface of conductive pattern 326 faces the viewer. As illustrated, the pattern defines an open area or region including a lower gap portion 342L and a portion 338L, which provides clearance for pins and conductors. Open or nonconductive portion 338L also includes three conductors which connect pins of the transducer to corresponding pins of a connector. As illustrated, pin 386 is connected by a conductor 396 to pin 4 of set 0003, pin 388 is connected by way of a conductor 398 to pin 3 of set 0003, and pin 390 is connected by way of a conductor 400 to pin 1 of set 0003. Pin 2 of set 0003 remains unconnected. The illustrated pin or socket set 0003 is arranged, in one arrangement, for connection of a MOLEX type 70543-0003 connector.

FIG. 4 is a perspective or isometric view of another current dividing current sensing arrangement 410 for use with a current sensor having rated range of current less than the maximum current to be sensed. In FIG. 4, an electrically conductive bus bar 412 defines two apertures 432, 434 dimensioned and spaced for connection to posts such as posts 312, 314 of FIG. 3a. Bus bar 412 supports four electrically conductive support posts 420a, 420b, 420c, and 420d. A printed-circuit board designated generally as 422 includes first and second mutually isolated conductive circuit portions 401 and 402 with a gap 442 therebetween. Electrically conductive portion or pattern 401 is electrically connected to posts 420a and 420b, and electrically conductive portion 402 is electrically connected to posts 420c and 420d. A current-sensing transducer 230 is coupled across the gap 442 lying between the conductive patterns 401 and 402. Current transducer or sensor 230 senses the current flowing from conductor 401 to 402 (or vice versa). When properly powered, transducer 230 produces its sensed signal in response to the current being sensed at an output terminal or port (not illustrated in FIG. 4), from which the signal is coupled (by paths not illustrated) to a socket of MOLEX connector 4003. As a result of the layout of the arrangement of FIG. 4, electrically conductive portion 401 is connected to a part of bus bar 412 which is spaced in the direction of current flow between apertures 432 and 434 from the part of the bus bar to which conductive portion 402 is connected. As a result of this spacing, that portion of the bus bar 412 lying between the locations or transverse plane of posts 420a, 420b and the locations or transverse plane of posts 420c, 420d represents a shunt resistance which parallels the path extending from conductor 401 through the sensor 230 to conductor 402. As a result, sensor 230 senses a proportion of the total current flowing from aperture 432 to aperture 434 of bus bar 412.

Thus, in general, according to the Roden et al. patent, a noncontacting current sensor having a rated capacity significantly less than the motor (or other) current to be measured is coupled to an electrical conductor for sensing the current in that conductor. The electrical conductor is paralleled by one or more additional similar conductors, so that only a fraction or portion of the current to be measured flows through the conductor associated with the sensor. The current sensor elements may be mounted on a printed-circuit board, which supports the elements, and also has one or more printed patterns which define a conductor associated with the sensor and at least one other conductor through which current can flow in parallel with the current in the sensor. Improved or alternative arrangements are desired.

SUMMARY OF THE INVENTION

An apparatus for measuring current applied to a power device includes a power device with an electrically conductive terminal region and a threaded aperture within the confines of the terminal region. The electrically conductive terminal region of the power device is for receiving current to be controlled by the power device. The apparatus includes a bolt having a threaded male portion corresponding to the threaded aperture. A conductive cable terminal lug is provided for receiving current to be applied to the power device. The conductive cable terminal lug defines an aperture at least large enough to clear the threaded male portion of the bolt. An electrical conductor arrangement defines first and second ends. The first end of the electrical conductor arrangement is in electrical contact with the conductive cable terminal lug, and the second end of the electrical conductor arrangement is in electrical contact with the electrically conductive terminal region of the power device. A current sensing device is coupled to the electrical conductor arrangement, for generating a signal representative of the current flowing in the electrical conductor arrangement. An insulating spacer defines a clearance aperture for the male portion of the bolt. The bolt extends through the aperture of the terminal lug and the clearance aperture of the insulating spacer, in the stated order, and has its male portion threaded into the threaded aperture of the power device, to thereby define a first path for the flow of current through the terminal lug, the bolt, and the threaded aperture and terminal portion of the power device, and a second path for the flow of current through the terminal lug, through the electrical conductor arrangement to the terminal region of the power device, whereby the current sensed by the current sensing device is less than the whole current flowing from the terminal lug to the power device.

In a particular embodiment of the apparatus, the electrical conductor arrangement comprises a second terminal lug affixed to the first end of the electrical conductor arrangement, and a third terminal lug affixed to the second end of the electrical conductor arrangement. The second and third terminal lugs each define a clearance aperture for the male portion of the bolt. In this embodiment, the bolt extends through the clearance apertures of the second and third lugs. In one version of this embodiment, the electrical conductor arrangement comprises an elongated electrical conductor, which may be flexible. In a further embodiment, the electrical conductor arrangement comprises a conductive trace on a printed wiring board. In one version, the printed wiring board defining a clearance aperture for the male portion of the bolt, and the electrical conductor arrangement comprises (a) a first electrically conductive trace extending on a first side of the printed wiring board from a first location near the clearance aperture to a second location, remote from the first location, and (b) a second electrically conductive trace extending on a second side of the printed wiring board from a location near the second location to a location near the clearance aperture.

An apparatus for measuring current applied to a power device includes a power device including an electrically conductive terminal region and a threaded aperture within the confines of the terminal region, for receiving current to be controlled. A bolt includes a threaded male portion corresponding to the threaded aperture. A conductive cable terminal lug for receiving current to be applied to the power device defines an aperture at least large enough to clear the threaded male portion. A printed-circuit board defines first and second broad surfaces, and an aperture extending between the first and second broad surfaces, which aperture is at least large enough to clear the threaded male connector. The printed-circuit board bears a first conductive pattern on the first broad surface, which extends at least from the aperture in the printed-circuit board to a first location on the printed circuit board, remote from the aperture. The printed-circuit board further bears a second conductive pattern on the second broad surface. The second conductive pattern extends at least from the aperture in the printed-circuit board to a second location. A current sensing device includes at least first and second terminals, with the first terminal being connected to the first conductive pattern on the first surface of the printed-circuit board at the first location, for generating a signal representative of the current flowing between the first and second terminals of the current sensing device. An electrical connection arrangement is coupled to the second terminal of the current sensing device and to the second conductive pattern at the second location, for completing a first electrical path extending from the aperture at the upper surface to the first terminal of the current sensing device by way of the first conductive pattern, through the current sensing device to the second terminal of the current sensing device, through the electrical connection arrangement to the second conductive pattern on the second broad surface at the second location, and through the second conductive pattern on the second broad surface back to the aperture. This first electrical path lacks a discrete resistor. The male portion of the bolt extends through the aperture in the terminal lug, through the aperture in the printed-circuit board, and into the threaded aperture in the power device, so that, when the bolt is tightened, the terminal lug is held against the first conductive pattern in the region of the aperture, and the terminal region of the power device is held against the second conductive pattern in the region of the aperture in the printed-circuit board, to thereby define a second electrical path from the terminal lug to the connection portion of the power device by way of an electrical conduction path extending through the aperture in the printed circuit board. The second electrical path also lacks a discrete resistor. The first and second electrical paths are in parallel, and the current sensor senses a current less than the total current flowing from the terminal lug to the power device in a ratio related to the relative resistances of the first and second paths. The bolt may be electrically conductive.

In one embodiment, the terminal lug defines a flat connection portion which bears on the first conductive pattern in the region of the aperture in the printed circuit board. In a particularly advantageous embodiment, the apparatus includes an annular electrical conduction path extending through the aperture in the printed circuit board, and making electrical connection to the first conductive pattern at the first broad surface of the printed circuit board, and making electrical connection to the second conductive pattern at the second broad surface of the printed circuit board.

In another advantageous embodiment, the apparatus further includes an insulating arrangement lying at least between the male threaded portion of the bolt and the annular electrical conduction path, for preventing current flow through the bolt. The annular electrical conduction path may be through plating on the interior walls of the aperture in the printed circuit board, or it may be a fabricated piece fusion-connected to the first and second conductive patterns.

BRIEF DESCRIPTION OF THE DRAWING

FIG. 3b is a plan view of the pattern of the upper printed conductor of the board of FIG. 3a, and FIG. 3c is a plan view of the pattern of the lower printed conductor of the board of FIG. 3a;

FIG. 6a is a simplified, partially exploded, perspective or isometric "god's eye" view of a first embodiment of a structure according to an aspect of the invention, in which a portion of the load current flows through a fastener or bolt, and FIG. 6b is a plan view of the upper surface of a printed circuit board of FIG. 6a;

DESCRIPTION OF THE INVENTION

Figure 1:
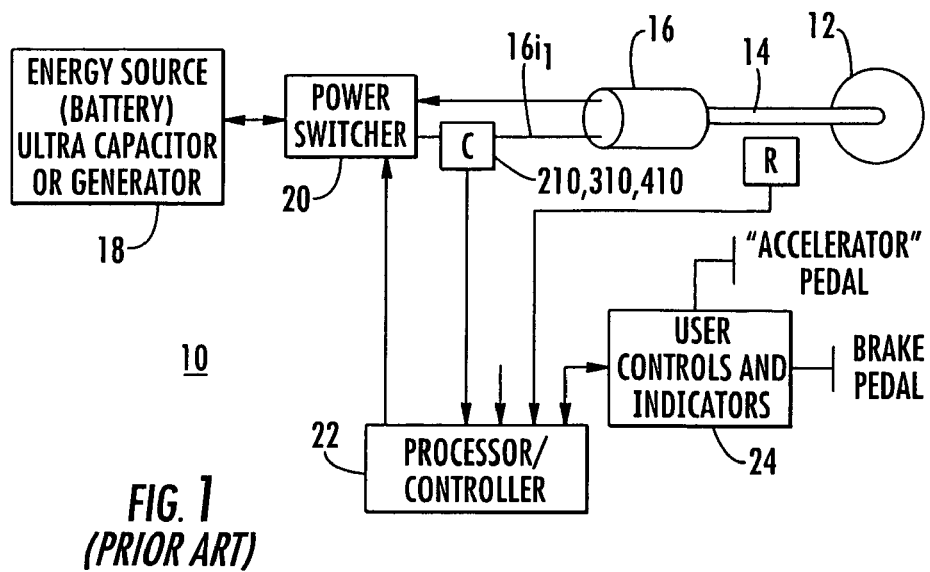
FIG. 1 is a simplified block diagram of a portion of an electrically driven vehicle as described in prior U.S. Pat. No. 6,528,960.
Figure 2A:
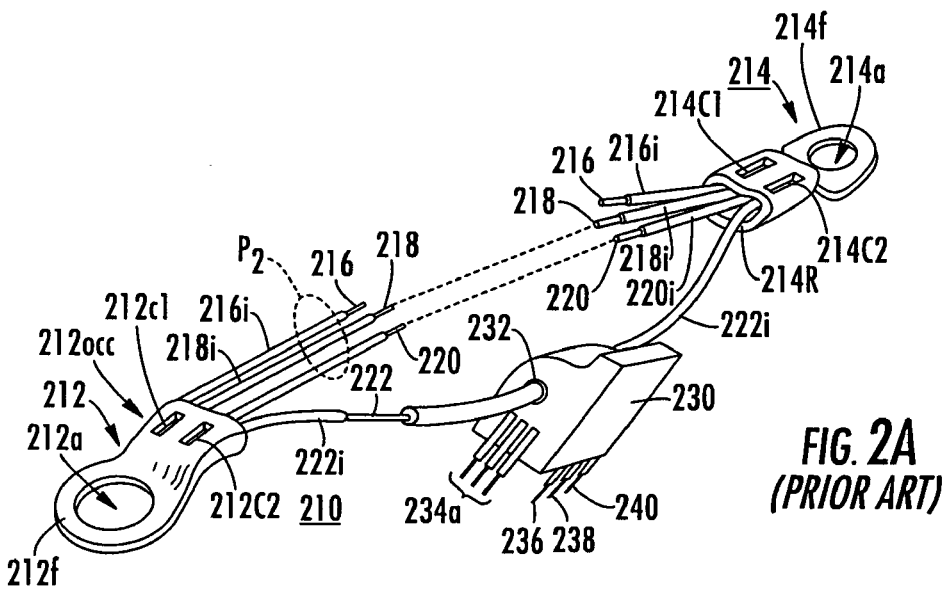
FIG. 2a is a perspective or isometric view of a prior art current measuring arrangement, which may be used in the vehicle of FIG. 1.
Figure 2B:
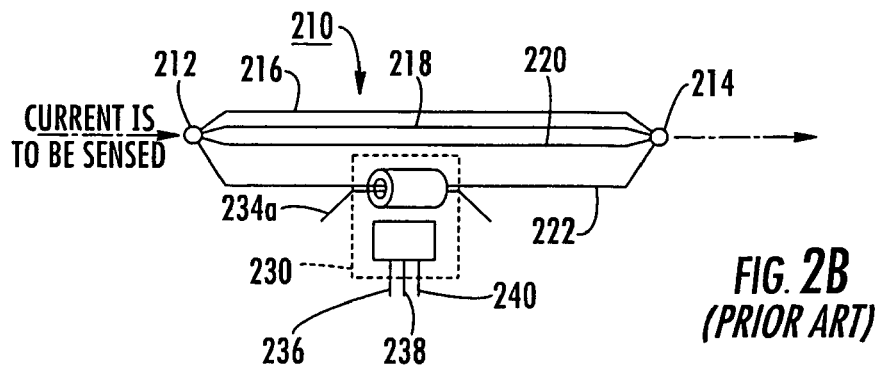
FIG. 2b is a schematic diagram thereof.
Figure 3A:
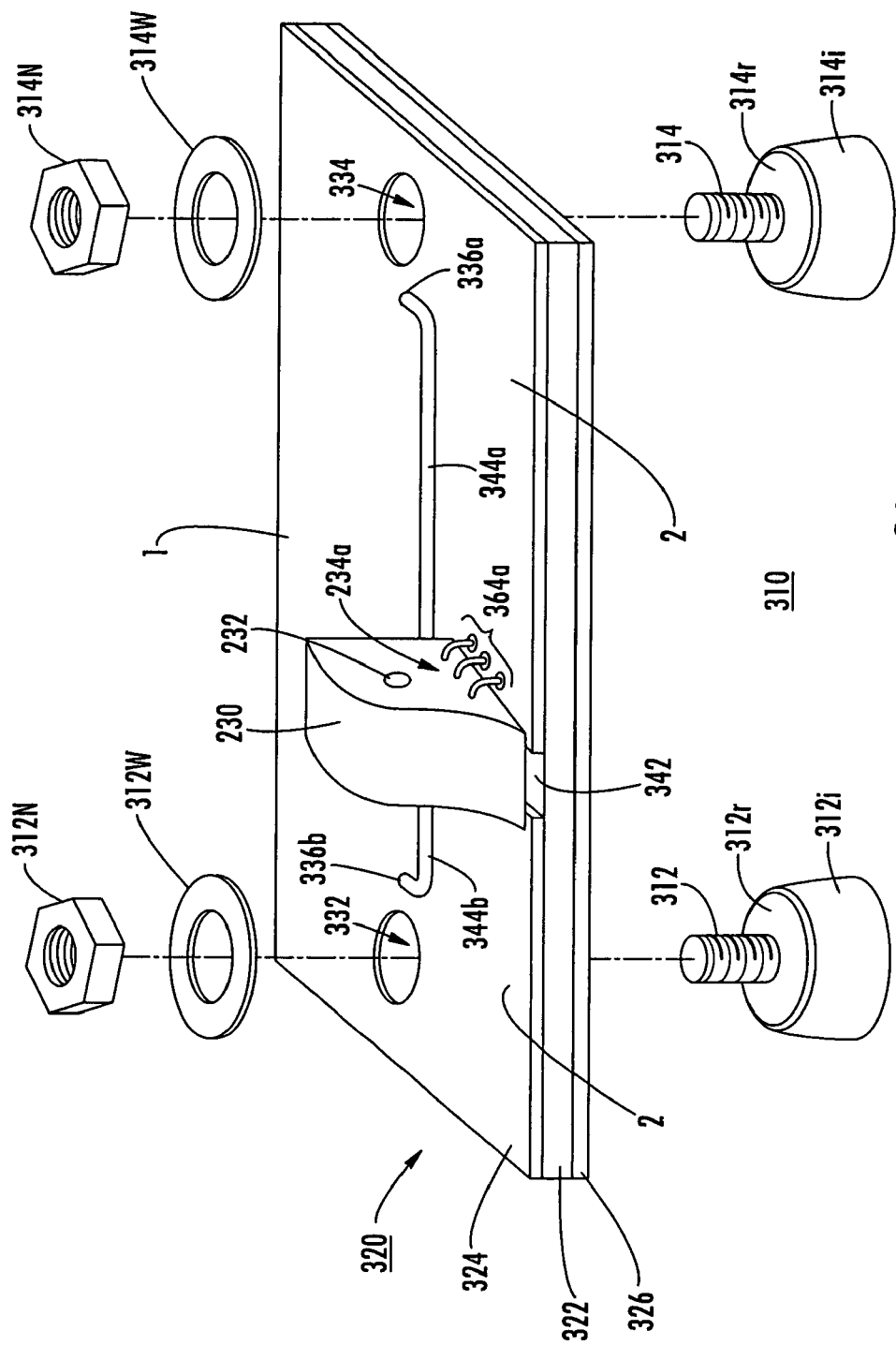
FIG. 3a is a simplified perspective or isometric view of a prior-art printed-circuit board assemblage usable in the arrangement of FIG. 1.
Figure 3B:
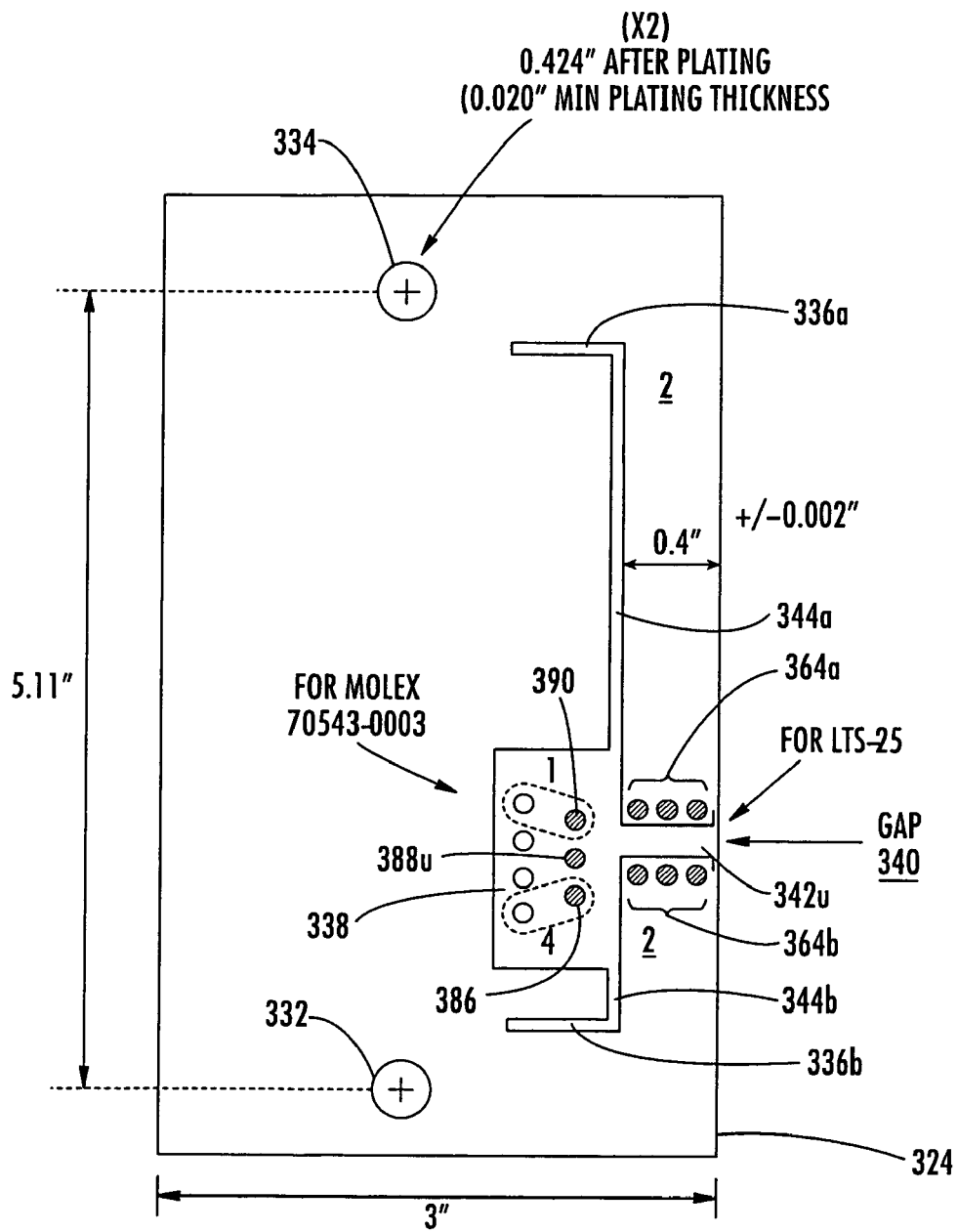
Figure 3C:
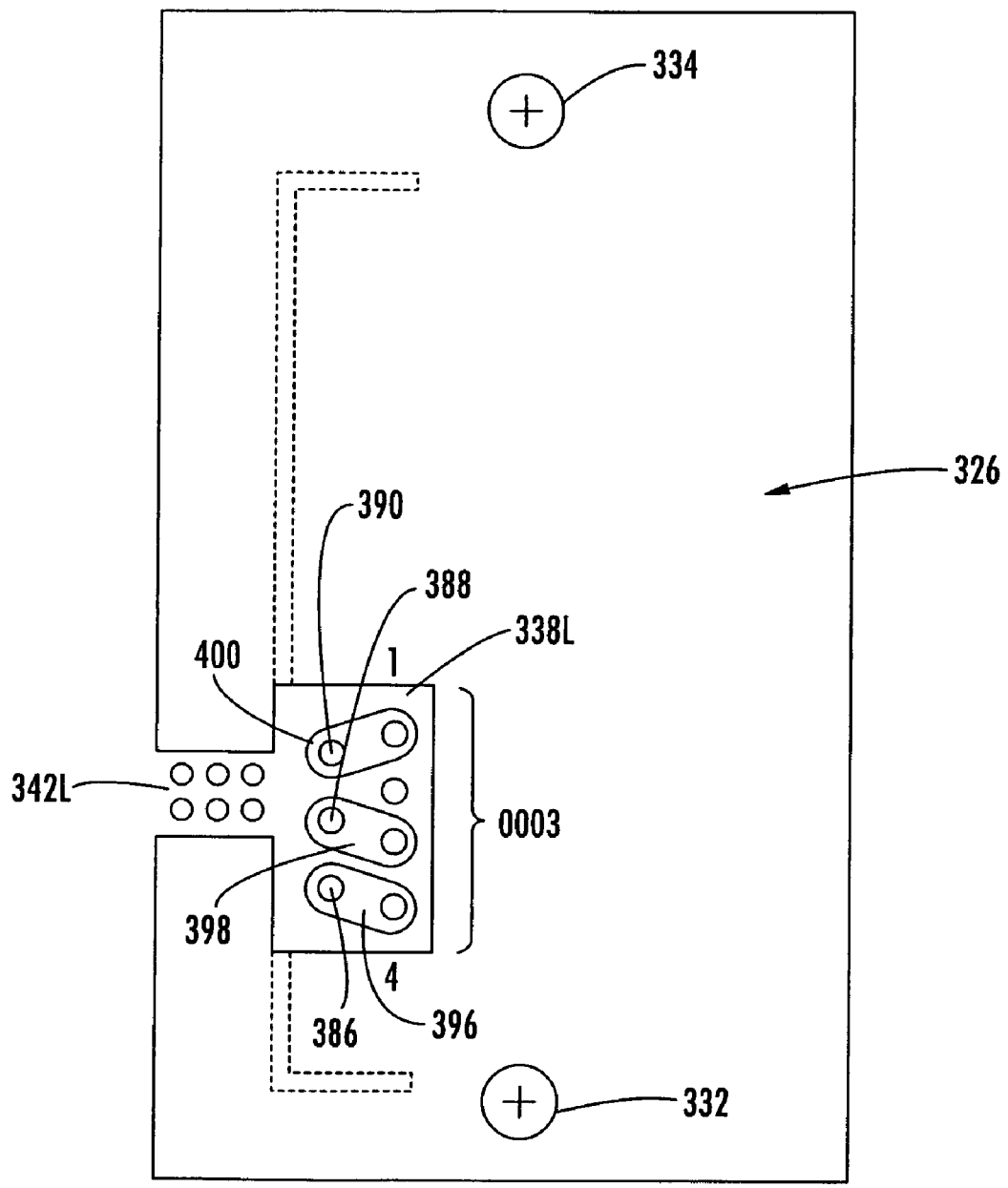
Figure 4:
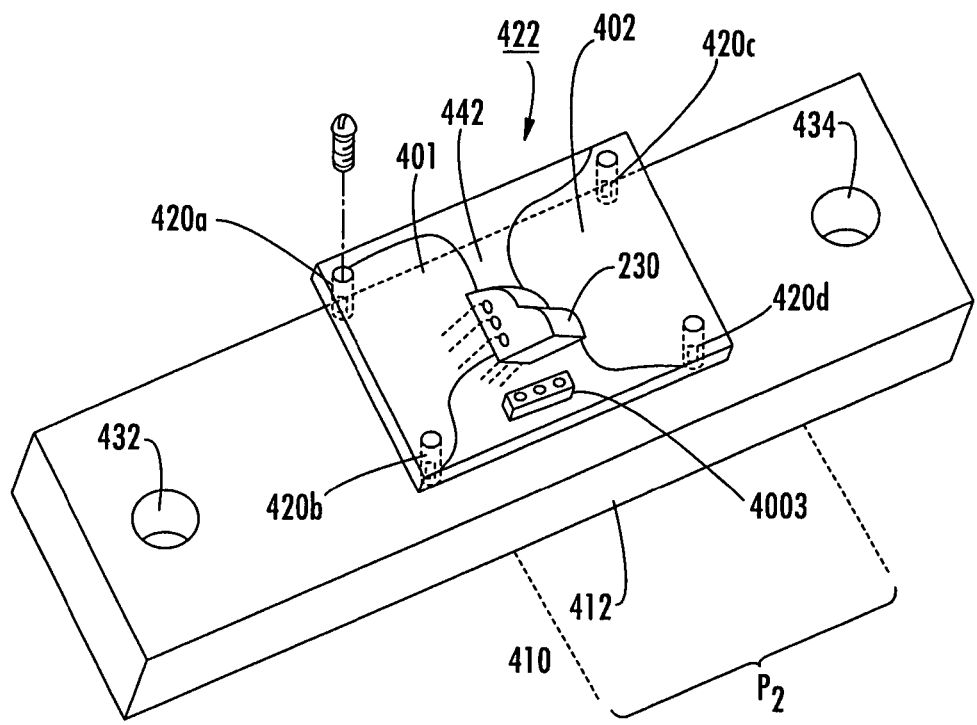
FIG. 4 is a simplified perspective or isometric view of a prior-art printed-circuit arrangement using an off-board shunting arrangement including a portion of a bus bar.
Figure 5:
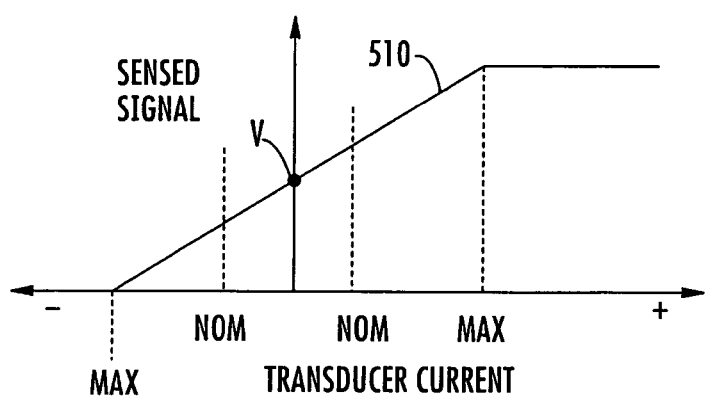
FIG. 5 is a simplified representation of the characteristics of a particular type of noncontacting current sensor, illustrating its limiting characteristic.

It will be noticed that the arrangement of FIG. 3a makes the current connections between the sensor and the external connections by way of a threaded stud and corresponding nuts. Equivalently, bolts could be used. In any case, electrical connections often require threaded connector devices. According to an aspect of the invention, a low-cost current sensor arrangement makes use of the bolted (or stud-and-nut) connection to simplify the current sensor arrangement.

FIG. 6a illustrates in simplified God's-eye view a structure 610 according to an aspect of the invention. In FIG. 6a, a solid-state power handling device, such as a gate-controlled bipolar switch, is illustrated as a block 612. A power terminal of the power device 612, such as an emitter or collector in the case of a gate-controlled bipolar device, is illustrated as an electrically conductive layer 614. A threaded aperture 616 is defined in the switch 612, to provide for tight contact of a current-carrying conductor to the power terminal 614. The control and second power electrode of switch 612 are not shown, for simplicity of illustration.

Current to be applied to electrode region 614 of power device 612 of FIG. 6a is supplied from a source (not illustrated) by way of a conductor bundle or electrical cable 618 insulated by an outer layer 620. Conductor bundle 618 terminates in a terminal lug 622 including a generally planar annular connection portion 622ac, which defines an aperture 622ap. A threaded bolt 624 defines a head 624h. The threaded portion of bolt 624 is dimensioned to correspond to the thread diameter and pitch of threaded aperture 616 in power device 612. In ordinary use without consideration of measurement of the electrical current, bolt 624 extends through aperture 622ap of terminal lug 622 and into threaded aperture 616. When bolt 624 is tightened, terminal lug 622 is brought into firm contact with electrode portion 614 of the power device 612, and current can be communicated therebetween. The remaining structure illustrated in FIG. 6a is provided to allow measurement of electrical current by the use of a current sensor 230.

Figure 6B:
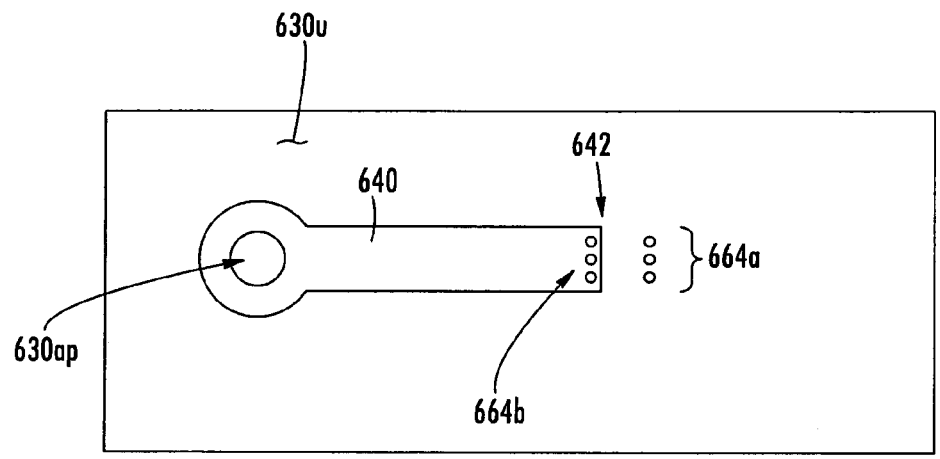

In FIG. 6a, both sides are illustrated of a printed circuit board 630. More particularly, printed-circuit board 630 is illustrated as having an upper broad surface 630u and a lower broad surface 630l, and an aperture 630ap extending therethrough. The main body 630mb of printed-circuit board 630 is made from an insulating material, as is common in the art. The upper surface 630u of printed-circuit board 630 bears a patterned layer of electrically conductive material 640, applied by plating or direct application and etching, in the customary manner. However produced, the layer 640 of conductive material on upper surface 630u extends in an annular manner around through aperture 630ap, and extends to a region 642 at which a current sensor 230 is affixed to the board, as by soldering of the connection terminals 234a to the upper surface of conductive layer 640 at a set of apertures 664b. The other set of conductors of current sensor 230, on the remote side not visible in FIG. 6a, extends through a set of through apertures 664a visible in the view of the bottom of printed circuit board 630, and also visible in the plan view of FIG. 6b.

The lower or bottom side 630l of printed-circuit board 630 of FIG. 6a is completely coated with a layer 630g of conductor, which in this embodiment is electrically isolated from upper-surface layer 640. A clearance region 650 may be defined in conductor 630g to avoid making unwanted electrical contact to pins 234a of current sensor 230 which may extend to or below conductor 630g. However, the conductors of sensor 230 which extend through apertures 664a are electrically connected to lower-surface conductor 630g.

The structure of FIG. 6a is assembled by passing the threaded portion of bolt 624 through aperture 622ap in terminal lug 622, through aperture 630ap extending through printed-circuit board 630, and into threaded aperture 616. When tightened, the head 624h of bolt 624 bears against the upper surface of terminal lug 622, and presses the lower surface of terminal lug firmly against the upper surface of conductor 640. At the same time, the bolt holds the lower surface of lower conductor 630g firmly against electrode 614 of the electrical control device 612.

Figure 7:
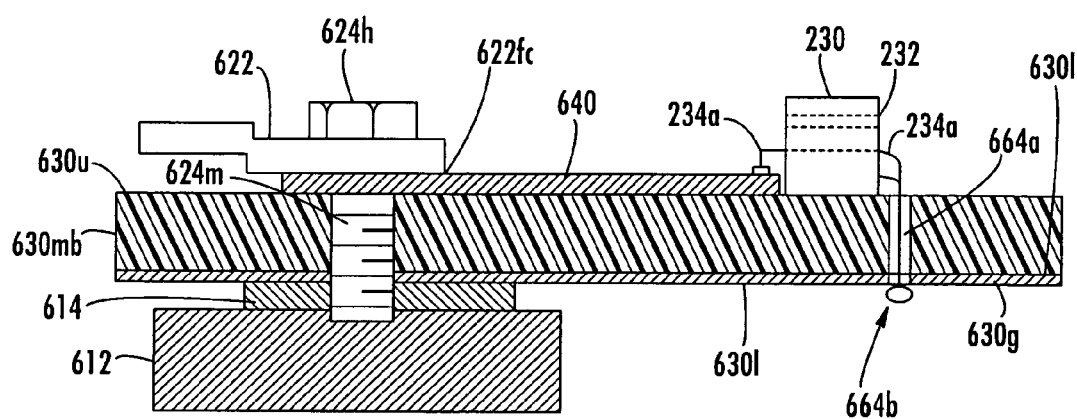
FIG. 7 is a simplified cross-sectional view of The structure of FIG. 6a in the assembled condition.

FIG. 7 is a simplified cross-sectional view of the structure of FIG. 6a in its assembled form. The bolt 624 is conductive, so there is a continuous path for electrical conduction from terminal lug 622 through bolt 624 to electrode 614 of device 612. In addition, as illustrated in FIG. 7, there is also a conductive path extending from terminal lug 622 through conductive path 640 to electrical connections 234a (which, as mentioned, extend fully through current sensor 230), and through apertures 664a to lower conductor layer 630g, and by way of conductor layer 630g to device electrode 614. Consequently, there are two separate and distinct paths for the flow of current from terminal lug 622 to electrode 614 of device 612, namely a first path extending vertically through the printed-circuit board by way of bolt 624, and a second path which extends by way of printed-circuit paths 640 and 630g and through current sensor 230. Thus, the simple tightening of a bolt to make the power connection to a current-handling device, which is already required in order to make such connections, additionally makes the parallel connection for the current sensor.

The current division in the arrangement of FIGS. 6a, 6b, and 7 depends upon the resistance of the bolt path in relation to the resistances of the printed-circuit paths. The resistance of the printed-circuit path is relatively easy to control, since the resistance will depend, in general, upon the thickness of the plating or conductor, and the shape of the current-conducting paths on the broad surfaces of the main body 630mb of the insulator. Since the tightness of the bolt affects the resistance of the main current conducting path, there may be some variation in the resistance which may affect the current division, and therefore the sensed current signal produced by the current sensor. This variation in resistance, should it be greater than desired, can be corrected by calibration. More particularly, the transfer characteristic of the completed arrangement of FIG. 6a may be stored in memory (not illustrated) and used to weight the current-representative signal produced by the current sensor 230.

Figure 8:
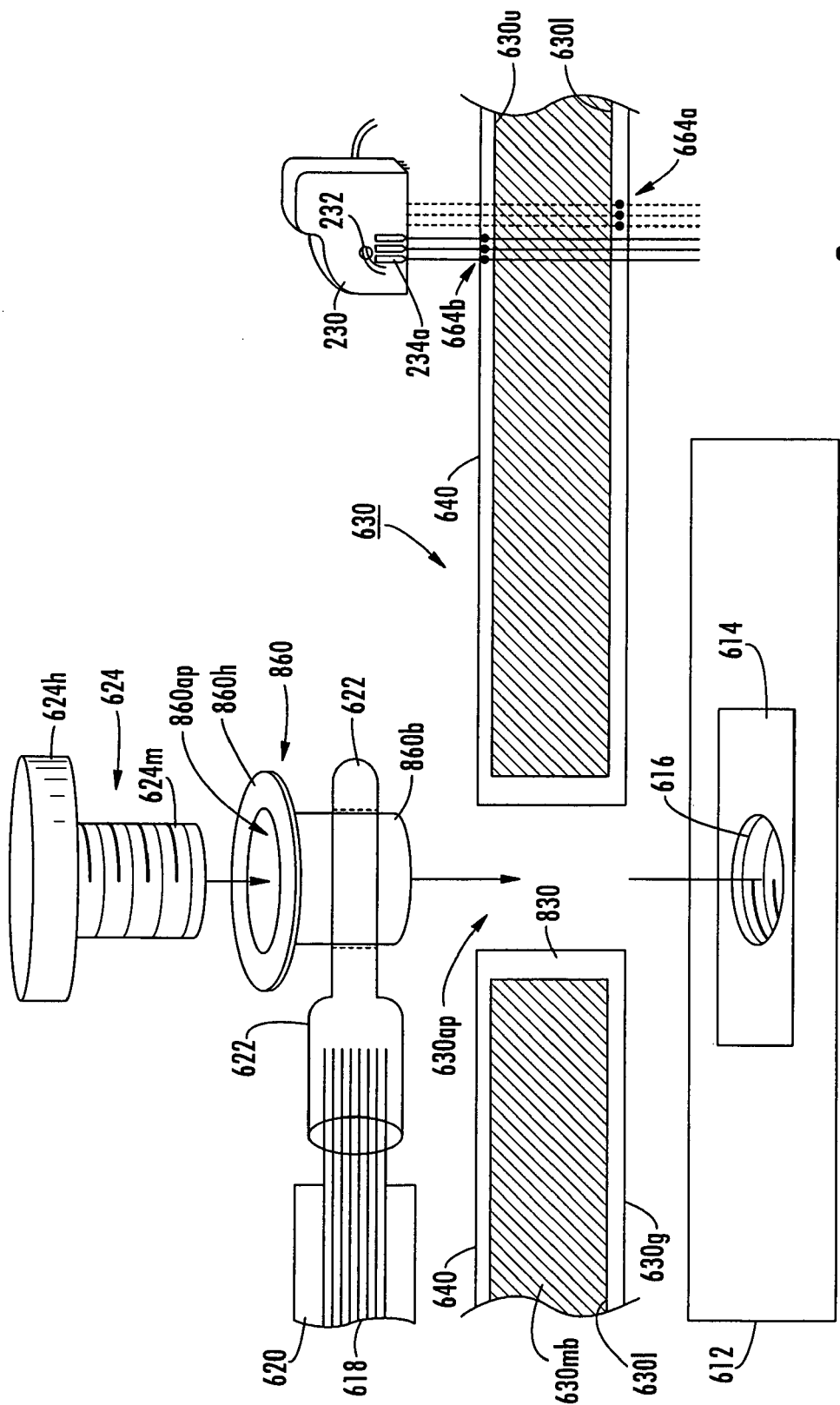
FIG. 8 is a simplified cross-sectional view of a structure similar to that of FIG. 6a, in which an insulator prevents current flow through the bolt, and flows instead through an annular plated-through conductor.

FIG. 8 illustrates in simplified, partially exploded cross-section another embodiment 810 of the invention. Elements of FIG. 8 corresponding to those of FIGS. 6a and 7 are designated by like reference alphanumerics. The arrangement of FIG. 8 differs from that of FIGS. 6a and 7 in that the bolt 624 does not carry any portion of the current, and the ratio of the current in the current sensor to the main current is therefore not dependent on the tightness of the bolt. In FIG. 8, through aperture 630ap is "plated through" by an annular conductor designated 830, which makes contact with the conductor 640 on the upper surface 630u of the insulator of main body 630mb of the printed-circuit board 630, and also makes contact with the conductor 640g on the lower surface 630l of the insulating main body 630mb of printed circuit 630. The annular opening or aperture of plated-through conductor 830 of FIG. 8 is dimensioned to clear an insulating washer 860 defining a cylindrical body 860b and a flat head 860h. Insulating washer 860 defines a clearance aperture 860ap for the threaded body of bolt 624. The structure of FIG. 8 is assembled by passing the threaded portion of bolt 624 through the aperture 860ap in insulating washer 860, and slipping the insulating body 860b of insulating washer 860 through the aperture in terminal lug 622. The threaded portion of the bolt 624, with the insulating washer 860 and terminal lug 622 in place thereon, is passed through aperture 630ap in the body of the printed-circuit board 630, and into engagement with threaded aperture 616 in the power device 612. When tightened, bolt 624 presses the lower surface of terminal lug 622 against that region of the conductive surface 640 lying thereunder, and also presses power device electrode 614 against the conductive surface 630g, to make good contact therewith. Bolt 624 is in electrical contact with electrode 614, but carries no current, because it is isolated from other electrical connections by the insulating washer 860. There continue to be two parallel paths for the flow of current in the arrangement of FIG. 8.

A first path extends from terminal lug 622 to the upper conductor 640, and axially through aperture 630*ap* by way of plated-through conductor 830 to electrode 614 of device 612. The second path extends from terminal lug 622 to the upper conductor 640, through conductor 640, through terminal 234*a* of current sensor 230 to lower conductor 630*g*, and by way of conductor 630*g* to electrode 614. The resistances of the two parallel paths are established, in the main, by the thickness of the printed-circuit conductors, and their layout. Since the layout is the same from unit to unit, and the conductor thickness can be readily controlled, the ratio of the sensed current to the main current can be controlled, without taking the tightness of the bolt into consideration.

In the arrangement of FIG. 8, the conductive paths 630*g* and 640 are made from a particular "weight" of copper, namely "10 oz," while the plated-through hole conductor 830 is made from a heavier material, possibly 30 oz. The current division ratio can be further controlled in this manner.

Figure 9:
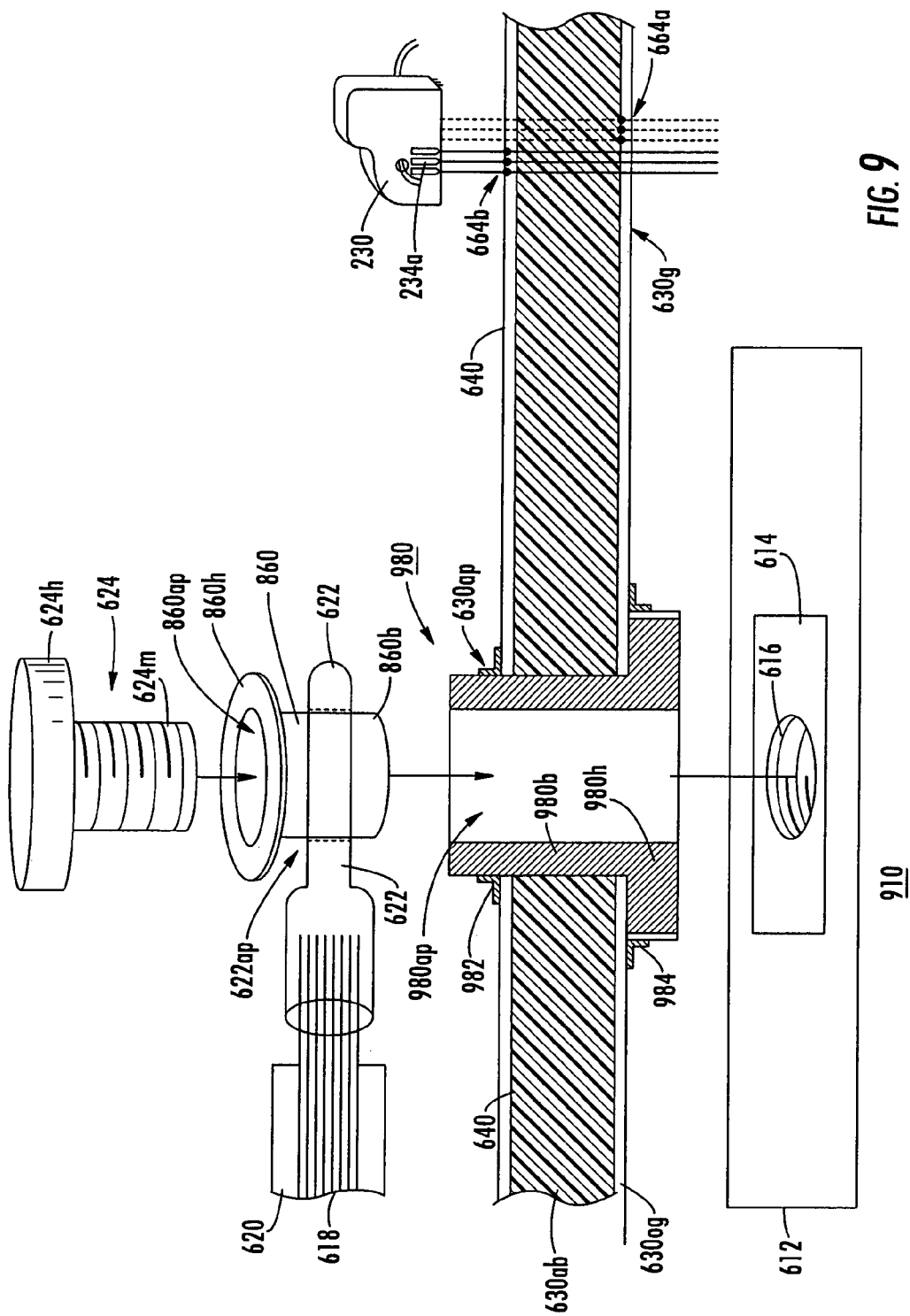
FIG. 9 is a simplified cross-sectional view similar to that of FIG. 8, in which the current flows through a fabricated annular structure for relieving compressive forces on the printed circuit board.

FIG. 9 illustrates another embodiment of the invention, in which compressive forces on the printed-circuit board are reduced or eliminated by the use of a formed spacer. Elements of FIG. 9 corresponding to those of FIG. 8 are designated by the same alphanumerics. In FIG. 9, a turned or otherwise formed electrically conductive washer or eyelet designated 980 defines an enlarged flat head or flange 980*h* and an annular cylindrical body 980*b*. Annular body 980*b* defines a central aperture 980*ap*, dimensioned to accept the body portion 860*b* of insulating washer 860. Conductive flanged washer 980 extends through an aperture through printed circuit board 630 which corresponds, except in size, with aperture 630*ap* of FIG. 6*a*, with its flange adjacent lower conductor 630*g*. An electrical connection is made between flanged washer 980 and the upper conductor 640 by way of a circumferential connection designated 982, and an electrical connection is made between the flange 980*h* of flanged washer 980 and the lower conductor 630*g* by way of a circumferential connection designated 984. The axial length of flanged washer 980 is such as to extend both above and below the printed circuit board 630. The structure of FIG. 9 is assembled by first inserting flanged washer 980 into aperture 630*ap* from the bottom, and soldering or otherwise fastening it into place. Next, the threaded body of bolt 624 is extended through aperture 860*ap* in insulating washer 860, followed by extending the body portion 860*b* of insulating washer 860 through the aperture 622*ap* of terminal lug 622. The body portion 860*b* of insulating washer 860 is then extended into the axial aperture 980*ap* in the flanged washer 980, and the threaded end of the bolt is threaded into aperture 616 in power device 612. As the bolt is tightened, compressive forces which might otherwise be applied to the printed circuit board are taken up by the flanged washer. However, the terminal lug 622 is brought into firm contact with the upper portion of the flanged washer 980, and connection electrode 614 of device 612 is brought into firm connection with the lower portion of flanged washer 980. The flanged washer itself makes good contact (as by fusion soldering) with the printed circuit board conductors 630*g* and 640. Two parallel paths continue to exist, with the flanged washer forming a part of one of the paths. In general, the flanged washer may be made from copper or copper alloy which is solderable. The material of which the flanged washer is made can be used to help to control the ratio of the sensed current to the total current, as by making if from beryllium copper (BeCu), which has a conductivity less than that of copper alone. The dimensions of the flanged washer then tend to be more determinative of the resistance than for highly conductive materials.

While a particular weight of copper, namely "10 oz" has been described in one embodiment of the invention, the weight may be selected in conjunction with the widths of the conductive traces to provide a suitable range of resistance. A common weight of copper is 3 oz, and such may be used if desired.

Figure 10:
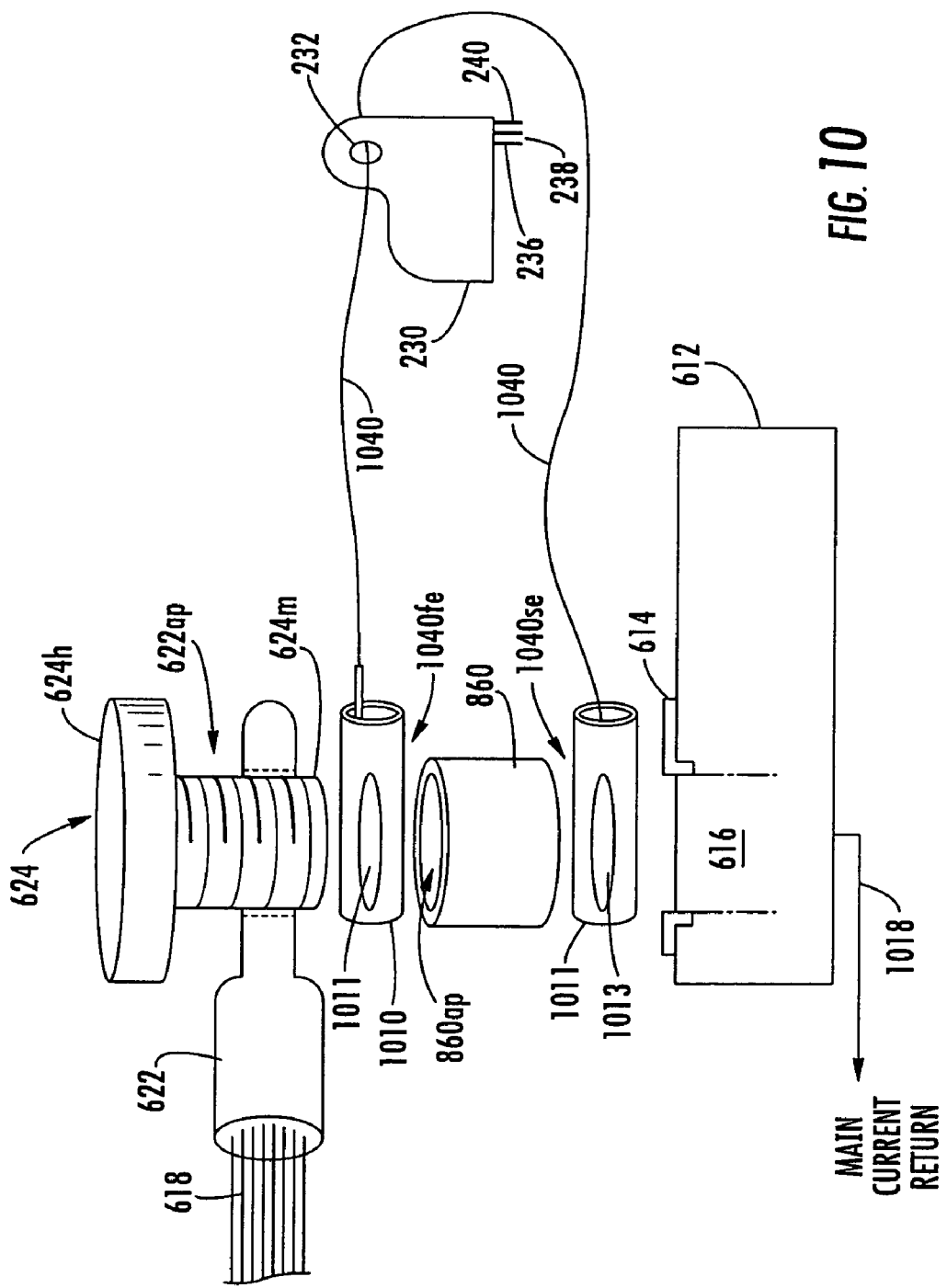
FIG. 10 is a simplified diagram, partially in perspective or isometric view, and partially in wiring-diagram form, and partially exploded to show details, illustrating the application of the invention in a context in which the current actually being sensed does not flow in a printed wiring board.

FIG. 10 is partially exploded to illustrate details of the structure. In FIG. 10, elements corresponding to those of FIGS. 6*a*, 6*b*, 8, and 9 are designated by like reference alphanumerics. In FIG. 10, the male portion 624*m* of electrically conductive bolt 624 extends through an aperture 1011 in a second terminal lug 1010, through an insulating spacer or washer 860, through an aperture 1013 in a third terminal lug 1012, and is threaded into aperture 616 in terminal portion 614 of power device 612. When bolt 624 is tightened, terminal lugs 622 and 1010 are in intimate and electrical contact, and terminal portion 614 is in electrical contact with terminal lug 1012. Terminal lug 1010 is isolated from direct electrical contact with terminal lug 1012 by insulating spacer 860. A first path for the flow of electric current between terminal lug 622 and terminal portion 614 of power device 612 is provided by bolt 624.

In FIG. 10, an electrical conductor 1040 is connected to terminal lugs 1010 and 1012, and extends through auxiliary aperture 232 in current sensor 230. Power is provided to sensor 230, and signal is taken therefrom, by way of terminals 236, 238, and 240. Conductor 1040 provides a second path for the flow of current from terminal lug 1010 to terminal lug 1012. The amount of current flowing in conductor 1040 will depend upon the relative resistances of the two paths for the flow of current in the arrangement of FIG. 10. The first path is the main current path which flows from conductor 618, terminal lug 622 and bolt 624 to terminal portion 614 and threaded aperture 616 of power device 612. The second path is the sensed current path which extends from conductor 618, through lug 622 to lug 1010, and through conductor 1040 to lug 1012 and terminal portion 614 of power device 612. In general, the dimensions of conductor 1040 can be selected to provide the desired current division ratio between the main current path and the sensed current path.

Thus, an apparatus for measuring current applied to a power device includes a power device (612) with an electrically conductive terminal region (614) and a threaded aperture (616) within the confines of the terminal region (614). The electrically conductive terminal region (614) of the power device is for receiving current to be controlled by the power device (612). The apparatus includes a bolt (624) having a threaded male portion (624*m*) corresponding to the threaded aperture (616). A conductive cable terminal lug (622) is provided for receiving current to be applied to the power device (612). The conductive cable terminal lug (622) defines an aperture (622*ap*) at least large enough to clear the threaded male portion (624*m*) of the bolt (624). An electrical conductor arrangement (640, 630*g*. 1010, 1012, 1040) defines first (1040*fe*) and second (1040*se*) ends. The first end (1040*fe*) of the electrical conductor arrangement (640, 630*g*. 1010, 1012, 1040) is in electrical contact with the conductive cable terminal lug (622), and the second end (1040*se*) of the electrical conductor arrangement (640, 630*g*. 1010, 1012, 1040) is in electrical contact with the electrically conductive terminal region (614) of the power device (612). A current sensing device (230) is coupled to the electrical conductor arrangement (640, 630*g*. 1010, 1012, 1040), for generating a signal representative of the current flowing in the electrical conductor arrangement (640, 630g. 1010, 1012, 1040). An insulating spacer (860) defines a clearance aperture (860ap) for the male portion (624m) of the bolt (624). The bolt (624) extends through the aperture (622ap) of the terminal lug (622) and the clearance aperture (860ap) of the insulating spacer (860), in the stated order, and has its male portion (624m) threaded into the threaded aperture (616) of the power device (612), to thereby define a first path for the flow of current through the terminal lug (622), the bolt (624), and the threaded aperture (616) and terminal portion (614) of the power device (612), and a second path for the flow of current through the terminal lug (622), through the electrical conductor arrangement (640, 630g. 1010, 1012, 1040) to the terminal region (614) of the power device (612), whereby the current sensed by the current sensing device (230) is less than the whole current flowing from the terminal lug (622) to the power device (612).

In a particular embodiment of the apparatus, the electrical conductor arrangement (640, 630g. 1010, 1012, 1040) comprises a second terminal lug (1010) affixed to the first end (1040fe) of the electrical conductor arrangement (640, 630g. 1010, 1012, 1040), and a third terminal lug (1012) affixed to the second end (1040se) of the electrical conductor arrangement (640, 630g. 1010, 1012, 1040). The second (1010) and third (1012) terminal lugs each define a clearance aperture (1011, 1013, respectively) for the male portion (624m) of the bolt (624). In this embodiment, the bolt (624) extends through the clearance apertures (1011, 1013) of the second (1010) and third (1012) lugs. In one version of this embodiment, the electrical conductor arrangement (640, 630g. 1010, 1012, 1040) comprises an elongated electrical conductor 1040), which may be flexible. In a further embodiment, the electrical conductor arrangement (640, 630g. 1010, 1012, 1040) comprises a conductive trace (640) on a printed wiring board. In one version, the printed wiring board defines a clearance aperture (630ap) for the male portion (624m) of the bolt (624), and the electrical conductor arrangement (640, 630g. 1010, 1012, 1040) comprises (a) a first electrically conductive trace (640) extending on a first side (630u) of the printed wiring board from a first location near the clearance aperture (630ap) to a second location (664b), remote from the first location, and (b) a second electrically conductive trace (630g) extending on a second side (6301) of the printed wiring board from a location near the second location (630g) to a location near the clearance aperture (630ap).

According to another aspect of the invention, an apparatus (610, 810, 910) for measuring current applied to a power device (612) includes a power device (612) including an electrically conductive terminal region (614) and a threaded aperture (616) within the confines of the terminal region (614), for receiving current to be controlled. A bolt (624) includes a threaded male portion (624m) corresponding to the threaded aperture (616). A conductive cable terminal lug (622) for receiving current to be applied to the power device (612) defines an aperture (622ap) at least large enough to clear the threaded male portion (624m). A printed-circuit board (630) defines first (630u) and second (6301) broad surfaces, and an aperture (630ap) extending between the first (630u) and second (6301) broad surfaces, which aperture (630ap) is at least large enough to clear the threaded male portion (624m) of the bolt. The printed-circuit board (630) bears a first conductive pattern (640) on the first broad surface (630u), which extends at least from the aperture (630ap) in the printed-circuit board (630) to a first location (642) on the printed circuit board (630), remote from the aperture (630ap). The printed-circuit board (630) further bears a second conductive pattern (630g) on the second broad surface (6301). The second conductive pattern (630g) extends at least from the aperture (630ap) in the printed-circuit board (630) to a second location (664b). A current sensing device (230) includes at least first and second terminals (the two sides of 234a), with the first terminal being connected to the first conductive pattern (640) on the first surface (630u) of the printed-circuit board (630) at the first location (664b), for generating a signal representative of the current flowing between the first and second terminals of the current sensing device (612). An electrical connection arrangement (connections 234a extending through holes 664a) is coupled to the second terminal of the current sensing device (612) and to the second conductive pattern (630g) at the second location (664a), for completing a first electrical path extending from the aperture (630ap) at the upper surface (630u) to the first terminal (230a) of the current sensing device (230) by way of the first conductive pattern (640), through the current sensing device (230) to the second terminal of the current sensing device (230), through the electrical connection arrangement to the second conductive pattern (630g) on the second broad surface (6301) at the second location (664a), and through the second conductive pattern (630g) on the second broad surface (6301) back to the aperture (630ap). This first electrical path lacks a discrete resistor. The male portion (624m) of the bolt (624) extends through the aperture (622ap) in the terminal lug (622), through the aperture (630ap) in the printed-circuit board (630), and into the threaded aperture (616) in the power device (612), so that, when the bolt (624) is tightened, the terminal lug (622) is held against the first conductive pattern (640) in the region of the aperture (630ap), and the terminal region (614) of the power device (612) is held against the second conductive pattern (630g) in the region of the aperture (630ap) in the printed-circuit board (630), to thereby define a second electrical path from the terminal lug (622) to the connection portion of the power device 612) by way of an electrical conduction path extending through the aperture in the printed circuit board (630). The second electrical path also lacks a discrete resistor. The first and second electrical paths are in parallel, and the current sensor (230) senses a current less than the total current flowing from the terminal lug (622) to the power device (612) in a ratio related to the relative resistances of the first and second paths. The bolt (624) may be electrically conductive.

In one embodiment, the terminal lug (622) defines a flat connection portion (622fc) which bears on the first conductive pattern (640) in the region of the aperture (630ap) in the printed circuit board (630). In a particularly advantageous embodiment, the apparatus (610, 810, 910) includes an annular electrical conduction path (830;980) extending through the aperture (630ap) in the printed circuit board (630), and making electrical connection to the first conductive pattern (640) at the first broad surface (630u) of the printed circuit board (630), and making electrical connection to the second conductive pattern (630g) at the second broad surface (6301) of the printed circuit board (630).

In another advantageous embodiment, the apparatus (610, 810, 910) further includes an insulating arrangement (860) lying at least between the male threaded portion (624m) of the bolt (624) and the annular electrical conduction path (830;980), for preventing current flow through the bolt (624). The annular electrical conduction path (830;980) may be through plating (830) on the interior walls of the aperture in the printed circuit board (630), or it may be a fabricated piece (980) fusion-connected to the first (640) and second (630g) conductive patterns.

What is claimed is:

1. An apparatus for measuring current applied to a power device, said apparatus comprising:
   a power device including an electrically conductive terminal region and a threaded aperture within the confines of said terminal region, for receiving current to be controlled;
   a bolt including a threaded male portion corresponding to said threaded aperture;
   a conductive cable terminal lug for receiving current to be applied to said power device, said conductive cable terminal lug defining an aperture at least large enough to clear said threaded male portion;
   an electrical conductor arrangement defining first and second ends, said first end of said electrical conductor arrangement being in electrical contact with said conductive cable terminal lug, and said second end of said electrical conductor arrangement being in electrical contact with said electrically conductive terminal region of said power device;
   a current sensing device coupled to said electrical conductor arrangement, for generating a signal representative of the current flowing in said electrical conductor arrangement;
   an insulating spacer defining a clearance aperture for said male portion of said bolt;
   said bolt extending through said aperture of said terminal lug and said clearance aperture of said insulating spacer, in the stated order, and having its male portion threaded into said threaded aperture of said power device, to thereby define a first path for the flow of current through said terminal lug, said bolt, and said threaded aperture and terminal region of said power device, and a second path for the flow of current through said terminal lug, through said electrical conductor arrangement to said terminal region of said power device, whereby the current sensed by said current sensing device is less than the whole current flowing from said terminal lug to said power device.

2. An apparatus according to claim 1, wherein said electrical conductor arrangement comprises;
   a second terminal lug affixed to said first end of said electrical conductor arrangement, said second terminal lug defining a clearance aperture for said male portion of said bolt;
   a third terminal lug affixed to said second end of said electrical conductor arrangement, said third terminal lug defining a clearance aperture for said male portion of said bolt; and wherein
   said bolt extends through said clearance apertures of said second and third lugs.

3. An apparatus according to claim 2, wherein said electrical conductor arrangement comprises an elongated electrical conductor.

4. An apparatus according to claim 3, wherein said elongated electrical conductor is flexible.

5. An apparatus according to claim 1, wherein said electrical conductor arrangement comprises a conductive trace on a printed wiring board.

6. An apparatus according to claim 1, further comprising:
   a printed wiring board defining a clearance aperture for said male portion of said bolt; and wherein
   said electrical conductor arrangement comprises a first electrically conductive trace extending on a first side of said printed wiring board from a first location near said clearance aperture to a second location, remote from said first location; and
   a second electrically conductive trace extending on a second side of said printed wiring board from a location near said second location to a location near said clearance aperture.

7. An apparatus for measuring current applied to a power device, said apparatus comprising:
   a power device including an electrically conductive terminal region and a threaded aperture within the confines of said terminal region, for receiving current to be controlled;
   a bolt including a threaded male portion corresponding to said threaded aperture;
   a conductive cable terminal lug for receiving current to be applied to said power device, said conductive cable terminal lug defining an aperture at least large enough to clear said threaded male portion;
   a printed-circuit board including first and second broad surfaces, and an aperture extending between said first and second broad surfaces, which aperture is at least large enough to clear said threaded male portion, said printed-circuit board bearing a first conductive pattern on said first broad surface, said first conductive pattern extending at least from said aperture in said printed-circuit board to a first location on said printed circuit board, remote from said aperture, said printed-circuit board further bearing a second conductive pattern on said second broad surface, said second conductive pattern extending at least from said aperture in said printed-circuit board to a second location;
   a current sensing device including at least first and second terminals, said first terminal being connected to said first conductive pattern on said first surface of said printed-circuit board at said first location, for generating a signal representative of the current flowing between said first and second terminals of said current sensing device;
   electrical connection means coupled to said second terminal of said current sensing device and to said second conductive pattern at said second location, for completing a first electrical path extending from said aperture at said first surface to said first terminal of said current sensing device by way of said first conductive pattern, through said current sensing device to said second terminal of said current sensing device, through said electrical connection means to said second conductive pattern on said second broad surface at said second location, and through said second conductive pattern on said second broad surface back to said aperture, said first electrical path lacking a discrete resistance means;
   said male portion of said bolt extending through said aperture in said terminal lug, through said aperture in said printed-circuit board, and into said threaded aperture in said power device, so that said terminal lug is held against said first conductive pattern in the region of said aperture, and said terminal region of said power device is held against said second conductive pattern in the region of said aperture in said printed-circuit board, to thereby define a second electrical path from said terminal lug to said terminal region of said power device by way of an electrical conduction path extending through said aperture in said printed circuit board, said second electrical path lacking discrete resistance means, whereby said first and second electrical paths are in parallel, and said current sensing device senses a current less than the total current flowing from said terminal lug to said power device.

8. An apparatus according to claim 7, wherein said terminal lug defines a flat connection portion which bears on said first conductive pattern in the region of said aperture in said printed circuit board.

9. An apparatus according to claim 7, wherein said bolt is electrically conductive.

10. An apparatus according to claim 7, wherein said second location on said printed circuit board is adjacent said first location.

11. An apparatus according to claim 7, further comprising:
an annular electrical conduction path extending through said aperture in said printed circuit board, and making electrical connection to said first conductive pattern at said first broad surface of said printed circuit board, and making electrical connection to said second conductive pattern at said second broad surface of said printed circuit board.

12. An apparatus according to claim 11, further comprising:
insulating means lying at least between said male threaded portion of said bolt and said annular electrical conduction path, for preventing current flow through said bolt.

13. An apparatus according to claim 11, wherein said annular electrical conduction path is through plating on the interior walls of said aperture in said printed circuit board.

14. An apparatus according to claim 11, wherein said annular electrical conduction path is a fabricated piece fusion-connected to said first and second conductive patterns.

15. An apparatus according to claim 7, wherein said electrical connection means comprises a plated-through hole extending through said printed-circuit board at said second location.

* * * * *